United States Patent [19]
Schmidt et al.

[11] Patent Number: 6,055,160
[45] Date of Patent: Apr. 25, 2000

[54] HIGH TEMPERATURE OVEN ELECTRICAL FEED THROUGH

[75] Inventors: Glen Eugene Schmidt; Eugene Lee Kesselhuth; Jeffrey John Bolduc; Ray Dean Dorris; Albert Eugene Waldorf, all of Bartlesville, Okla.

[73] Assignee: Siemens Applied Automation, Inc., Bartlesville, Okla.

[21] Appl. No.: 09/004,960

[22] Filed: Jan. 9, 1998

[51] Int. Cl.[7] ..................................................... H05K 5/06
[52] U.S. Cl. .......................... 361/742; 361/753; 361/796; 361/818; 174/35 GC
[58] Field of Search ..................................... 361/728, 736, 361/742, 748, 753, 752, 758, 779, 784, 790, 796, 800, 818, 803, 816; 174/35 R, 35 GC; 277/165; 439/55; 206/706, 709

[56] References Cited

U.S. PATENT DOCUMENTS

| | | | |
|---|---|---|---|
| 5,031,076 | 7/1991 | Kiku | 361/816 |
| 5,557,064 | 9/1996 | Isern-Flecha et al. | 174/35 MS |
| 5,617,300 | 4/1997 | Anzawa et al. | 361/790 X |
| 5,703,761 | 12/1997 | Heiss | 361/800 |
| 5,761,031 | 6/1998 | Ajmani | 361/753 X |

OTHER PUBLICATIONS

ANSI/IPC–D–275 "Design Standard for Rigid Printed Boards and Rigid Printed Board Assemblies", Sep. 1991, pp. 64–65, IPC, Lincolnwood, IL.

Primary Examiner—Leo P. Picard
Assistant Examiner—Jayprakash N. Gandhi
Attorney, Agent, or Firm—J. Marc Asperas

[57] ABSTRACT

An electrical feed through for use in a high temperature oven such as the oven in a gas chromatograph. The feed through includes printed circuit boards which are maintained in compression to prevent the boards from physically separating at the elevated temperatures used in the oven. The structure that provides the compression also does not allow any flexure, torsional or longitudinal stress on the boards. The boards include an enhanced connector pad which is made from a continuous annular copper ring which is connected to all of the conductive layers of the board.

14 Claims, 4 Drawing Sheets

HIGH TEMPERATURE OVEN ELECTRICAL FEED THROUGH

FIELD OF THE INVENTION

This invention relates to high temperature ovens and more particularly to an electrical feed through for such ovens.

DESCRIPTION OF THE PRIOR ART

Analytical measurement ovens such as those used in gas chromatographs maintain elevated temperatures for the purpose of providing proper conditions for a process measurement to take place. The measurement includes the use of electrical sensors. The processing of the measurement requires that some form of electrical connection exit the oven.

In a low temperature application, readily available varieties of wire and ordinary interconnection devices allow for numerous solutions in making the electrical connection. Some analytical oven applications, however, have continuous temperatures that routinely exceed the most extraordinary of temperature ratings for electrical and electronic interconnection and wiring devices. For example, it is desirable that a gas chromatograph oven be capable of operation at a temperature of at least 225° C.

Referring now to FIG. 1, there is shown a simplified drawing of an industrial gas chromatograph 10 with an electrical feed through assembly 12 embodied in accordance with the prior art. Chromatograph 10 includes an oven 14 and an electronics enclosure 16.

Elevated temperatures are maintained in oven 14, where electrical sensors (not shown) make measurements. The oven 14 is maintained at tightly controlled temperatures using thermal sensors and electrical heaters (both not shown). The sensor signals and heater control currents all must pass through the assembly 12 to the electronics enclosure 16.

Enclosure 16 provides an environment that is normal for electronic circuitry. It is important, however, that very little heat is conducted into the enclosure 16 from the oven 14 as the electronic circuitry is sensitive to heat. Explosive gases may be present where chromatograph 10 is installed. The electronic circuitry in enclosure 16 is capable of igniting explosive gases under fault conditions. For this reason, enclosure 16 is constantly purged/pressurized with an air source delivered from outside the hazardous area. This purging or pressurization is a normal and accepted practice in North America and Europe for electronic equipment used in a hazardous area.

Some of the oven components 14 may also contain explosive gases as part of the normal processes. Measures are taken to prevent ignition. Components in the oven must be able to contain an explosion, and prevent continuation of flames or igniting gases into the surrounding hazardous area.

Referring now to FIG. 2, there is a simplified illustration of feed through assembly 12. Assembly 12, in its simplest form, includes a group of wires 18a, 18b, 18c, 18d; and a low loss coaxial cable 20. Each of the wires 18a, 18b, 18c, 18d are the combination of a wire insulated with TEFLON insulation. The wire is enclosed in a high temperature polyolefin shrink tubing. The low loss coaxial cable 20 is also similarly specially prepared.

The assembly 12 also includes a conduit 22 through which the wires 18a–18d and cable 20 pass. Conduit 22 has a threaded sealing hub 24. The sealing hub 24 includes a conduit sealing compound 28 such as Chico A, which is available from Crouse-Hinds. The sealing hub further includes an additional layer 26 of the polyurethane resin to provide a gas tight seal.

Assembly 12 requires a great deal of labor to manufacture. There is much preparation of the wiring and the sealing materials are not easy to work with as they require preparation and curing in well ventilated areas.

In addition, very few connections can be made through assembly 12. This is due to the size of wires 18a–18d and cable 20 along with the maximum fill requirements for conduit 22 and the necessity to provide separation between the conductors to guarantee proper flow of the sealing compounds. Therefore, a gas chromatograph usually includes several feed through assemblies 12 and associated penetrations of oven 14. Assembly 12, once installed, is very difficult to service or even remove for service.

Further, assembly 12 has been shown to be unsuitable for oven temperatures above 200° C. The TEFLON insulation used on wires 18a–18d begins to cold flow, that is, become plastic, at such temperatures. Therefore, any pressure placed on the wires 18a–18d will cause the insulation to extrude and create a leakage path. Also, the sealing compound 28 cannot withstand the high temperatures. Other high temperature wires, such as glass braid wiring, cannot tolerate humidity of any sort. Humidity and condensation are prevalent in high temperature gas chromatography applications.

One possible solution is to use components qualified for use in military and space applications as these components have the broadest temperature and environmental requirements. The highest normal military qualification temperature is 125° C. There are instances where such components can be specified up to 175° C. but this still does not meet the requirements for use in analytical ovens such as the oven in a gas chromatograph.

The inventors have considered other possible solutions as a replacement for assembly 12. One such possible solution was to use glass or ceramic type connectors. Such connectors, however, consume an immense amount of space, and they do not solve the need to bring sensitive coax signals through the feed through. Another such possible solution was to use flexible or rigid printed circuits, but there was not until the present invention any way to guarantee that the board would not delaminate at the desired temperatures. The materials used in printed circuit boards are specified for maximum temperatures of 175° C.

SUMMARY OF THE INVENTION

The present invention is embodied as an electrical feed through assembly which is to be inserted in a high temperature oven. The assembly has one or more printed circuit boards around which are positioned one or more sheets of compressible material. The printed circuit boards and compressible material are positioned between the two halves of a clam shell type housing. When the two halves are joined together to sufficiently compress the compressible material, that material extrudes over the edges of the printed circuit boards.

The present invention is also embodied as a method for manufacturing an electrical feed through which is to be inserted in a high temperature oven. The feed through has housing with two halves. In the method, one or more printed circuit boards are surrounded on the side that faces the interior of each housing half with compressible material and the halves are assembled with the boards therein such that the compressible material extrudes over the edges of the circuit boards.

The present invention also has a printed circuit board that one or more spaced holes through the board and each of the holes is plated with copper to a thickness of about 5 mils. The circuit board also has one or more electrically conductive layers. Each of the layers have three ounce copper circuits. Each of the layers also has an annular ring of copper that surrounds each of the spaced holes and is connected to the copper circuits. The annular ring does not have any thermal relief. The copper plating in each of the holes mechanically connects all of the annular rings in the hole to each other.

DESCRIPTION OF THE PREFERRED EMBODIMENT(S)

Figure 3:
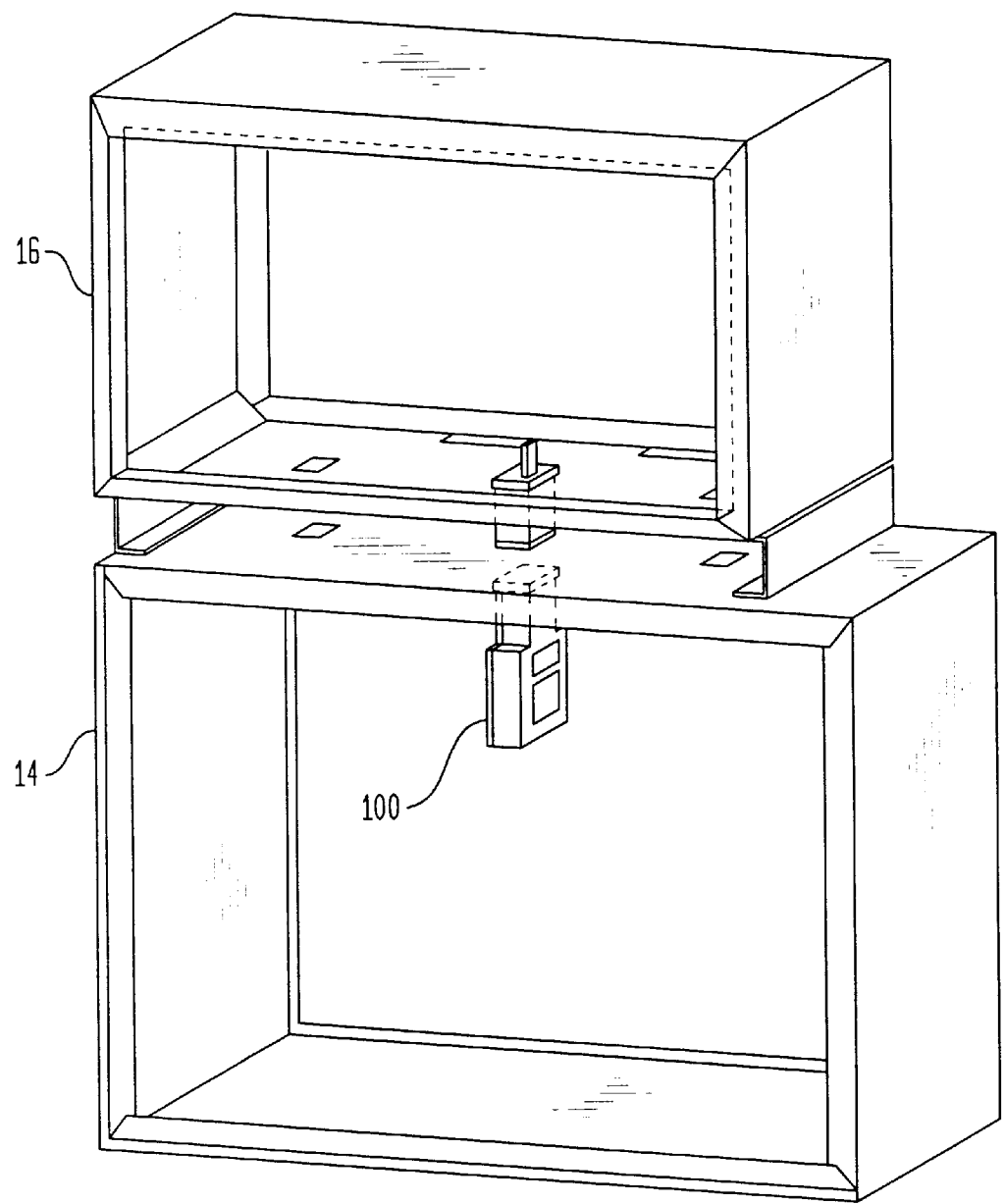
FIG. 3 shows a simplified drawing of a gas chromatograph that includes the electrical feed through assembly of the present invention.

Referring now to FIG. 3, there is shown a simplified diagram of an industrial gas chromatograph 10 which includes the electrical feed through assembly 100 of the present invention. As will be described in more detail below, the assembly 100 includes printed circuit boards. Printed circuit boards are created essentially as thin etched layers of copper on a substrate or a base material, and then laminated at high temperatures with insulating intermediate layers. Since copper has a melting point of 1083° C., the copper layers of the printed circuit board will not degrade at the desired gas chromatograph operating temperature of at least 225° C.

The base material of the printed circuit board, polyimide prepreg in this instance, can be rated anywhere from 175° C. to 300° C., based upon the life expectancy of the polyimide. There are grades of polyimide that will give a projected ten year life at temperatures of 225° C. or higher.

The weakest link, however, is the bond between the polyimide and copper. The two materials are laminated and bonded at temperatures which are not much higher than the desired 225° C. operating temperature for the gas chromatograph oven. With the bonding temperature so close to the desired gas chromatograph oven operating temperature, the printed circuit board will delaminate and fail if subjected to years of operation at a temperature of 225° C.

The electrical feed through assembly 100 of the present invention was designed on the assumption that the board can and potentially will delaminate when used in a gas chromatograph oven operating at the desired 225° C. temperature. Assembly 100 maintains the printed circuit boards used therein in constant compression for the life of the gas chromatograph oven to thereby keep the printed circuit layers of the boards from physically separating, even when exposed to the desired operating temperature for a prolonged period of time. Laminating materials when they degrade primarily lose their adhesion to copper and become brittle, if flexed. The mechanical structure of assembly 100 does not allow any flexure, torsional or longitudinal stress on the printed circuit boards in the assembly.

Figure 4:
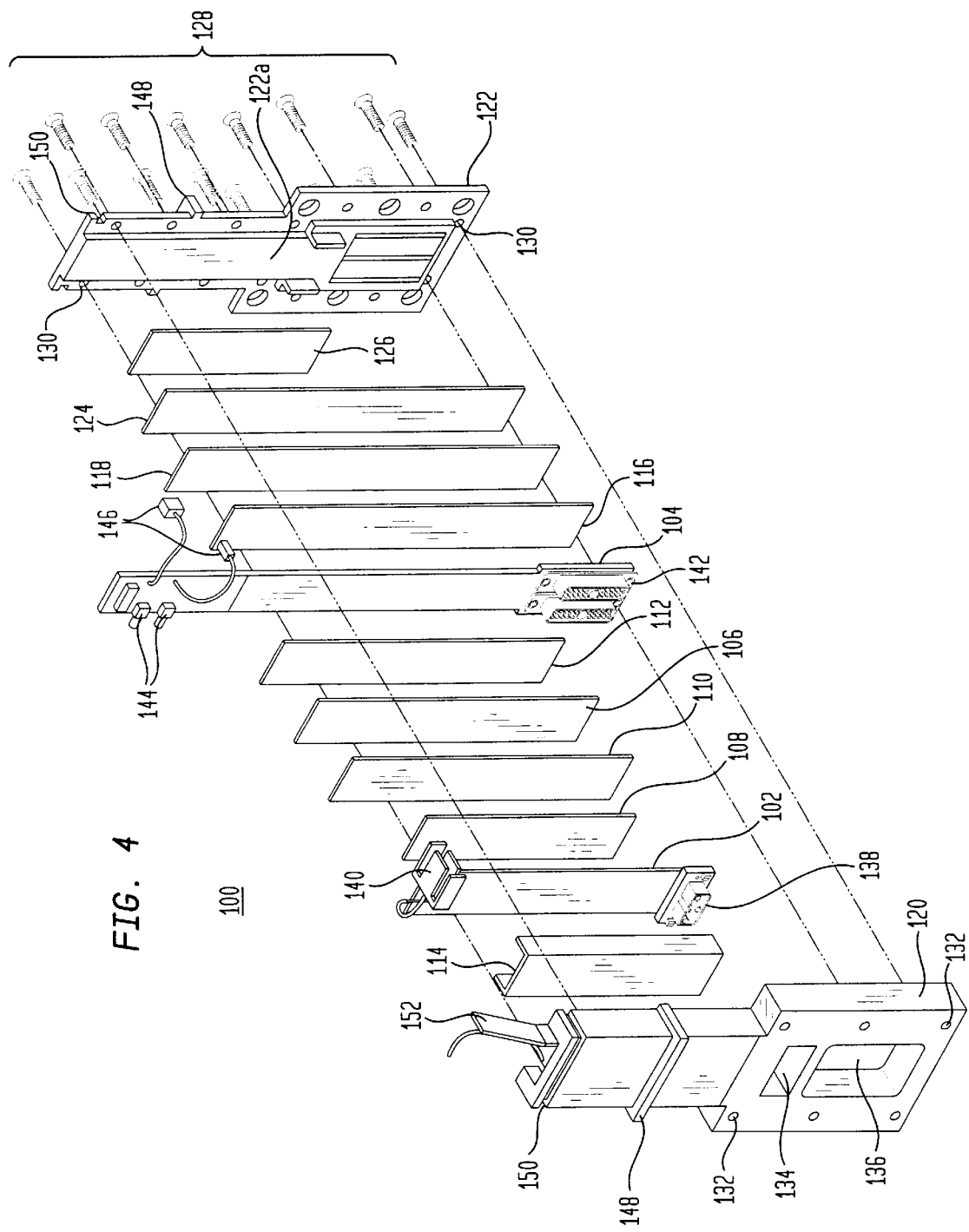
FIG. 4 shows an exploded detail view of the assembly of the present invention.

Referring now to FIG. 4, there is shown an exploded detail view of the assembly 100. The assembly includes two printed circuit boards 102 and 104. Board 102 supplies the AC current to the heaters in oven 14 of FIG. 3. The heaters are not shown in FIG. 3. The board 104 contains detectors and thermocouple wiring and provides paths for DC signals. As is shown in FIG. 4, the sides of boards 102 and 104 that face each other are separated by an electromagnetic shield 106. A sheet of plastic 108, acting as a spacer, followed by a sheet of heat resistant polyimide 110 separates the side of board 102 that faces board 104 from shield 106. A sheet of compressible closed cell silicone foam 112 separates the side of the shield 106 that faces DC board 104 from the side of board 104 that faces board 102.

An electromagnetic shield 118 is separated from the side of board 104 that does not face board 102 by a sheet of heat resistant polyimide 116. The electromagnetic shields 106 and 118 eliminate induced noise on each board by the close proximity to each board of the signals on the other board. Such shielding against the high currents generated on AC board 102 is essential.

The assembly 100 further includes sheets 114, 126 of compressible closed cell silicone foam. The sheet 126 is separated from shield 118 by a sheet of heat resistant polyimide 124. The assembly also includes a stainless steel clam shell type housing having first and second halves 120, 122. The inside face of clam shell half 120 has a trough whose width is sized to snugly receive boards 102, 104; shields 106, 118; polyimide 110, 116, 124; spacer 108; and silicone sheets 112, 114, 126 when assembly 100 is assembled. The inside face of clam shell half 122 has a raised portion 122a which is substantially complementary in shape to the trough in clam shell half 120.

The assembly 100 also further includes countersunk screws, collectively, 128, the threads of which are not shown in FIG. 4. When assembly 100 is assembled the screws 128 each pass through an associated circular opening 130 in clam shell half 122 to an associated corresponding circular opening 132 in clam shell half 120.

When assembly 100 is assembled, the silicone sheets are extended around the sides of the sheets of spacer, polyimide, silicone and shield. The clam shell housing forces the sides of silicone sheet 114 to compress and extrude around the edges of boards 102, 104 and wrap tightly around those boards and the sheets of spacer, polyimide, silicone and shield included in the assembly. The extruded silicone forms a nearly perfect protection against flame passage and allows the assembly 100 to satisfy flame path requirements for hazardous areas. In addition, the extruded silicone assures that any existing leakage paths are long and narrow forming what is known to those familiar in hazardous area certification as "flame cooling paths." Such paths slow the flow of a hot gas sufficiently so that the gas is caused to cool below ignition temperatures.

The board 104 also contains the signals for a flame ionization detector (FID)[not shown]. The FID is a specialized sensor used in gas chromatographs. As is well known to those in the gas chromatograph art, the signal produced by the FID is extremely susceptible to interference and the FID signal can easily be disturbed by both leakage current and other signals.

Figure 1:
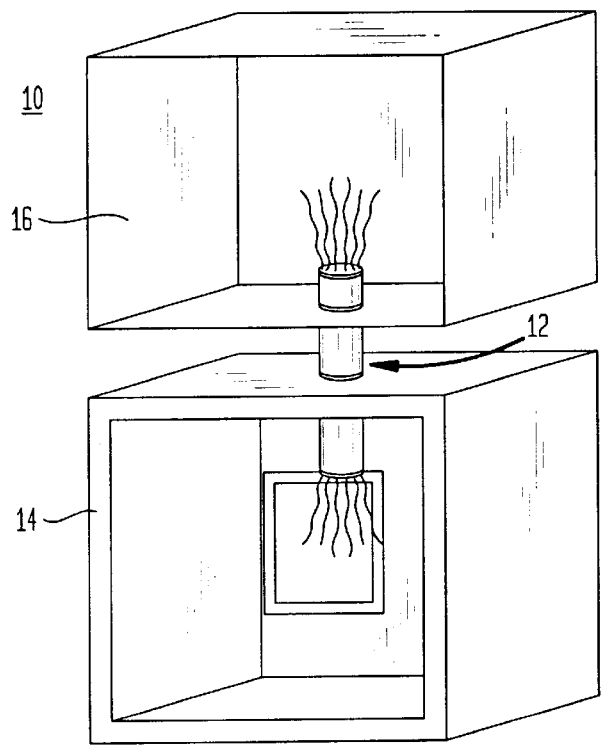
FIG. 1 shows a simplified drawing of a gas chromatograph with an electrical feed through assembly embodied in accordance with the prior art.
Figure 2:
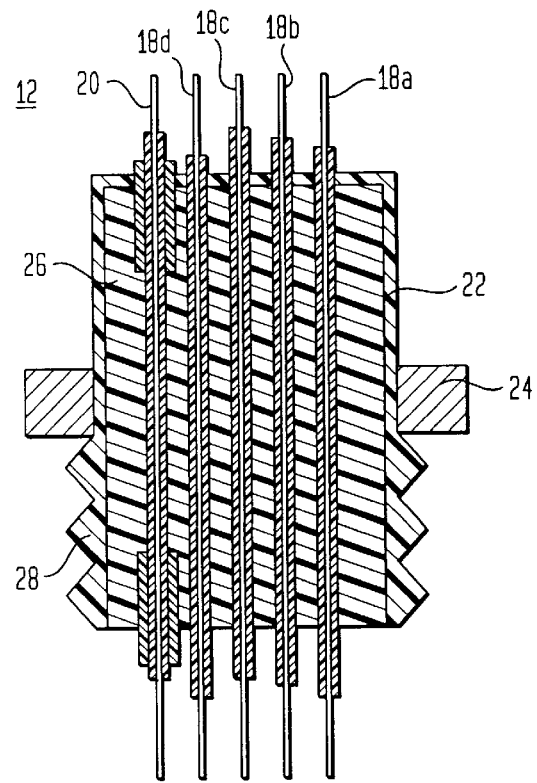
FIG. 2 shows a simplified illustration of the electrical feed through assembly of FIG. 1.

In the electrical feed through assembly of the prior art shown in FIG. 2, the FID signal is carried by the low loss coaxial cable 20. The FID signal is so sensitive, however, that movement of cable 20 can introduce microphonic noise effects that disturb the performance of the gas chromatograph analyzer. The present invention has eliminated the use of a low loss coaxial cable and allows the FID signal path to be held without movement, thereby virtually eliminating noise effects on the FID signal due to movement.

As can be seen in FIG. 4, clam shell half 120 includes cutouts 134 and 136. As can also be seen in FIG. 4, AC board 102 includes a connector 138 at one end and a connector 140 at its other end. As can further be seen in FIG. 4, the DC board includes two connectors 142 at one end and two coaxial connectors 144 and two plug-in type connectors 146 at its other end.

As is shown in FIG. 4, each clam shell half 120, 122 has a raised edge 148 on its outer face and the sides associated therewith. When assembly 100 is assembled and inserted in oven 14 and electronics enclosure 16, the raised edge 148 abuts the top inner surface of the oven 14. As also can be seen in FIG. 4, each clam shell half includes a slot 150 in its outer face and the sides associated therewith. When assembly 100 is assembled and inserted in oven 14 and electronics enclosure 16, the slot 150 abuts the top outside surface of oven 14. A clip, not shown, slides into slot 150 to hold the assembly 100 against the top outer surface of the oven. Clam shell half 120 also includes a ground terminal 152.

Figure 5:
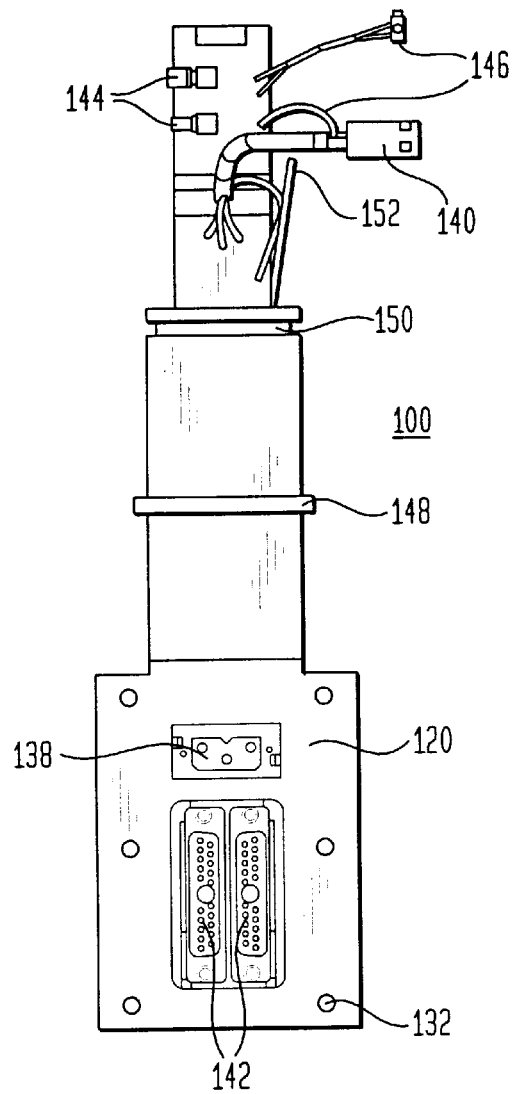
FIG. 5 shows a front view of the assembly of the present invention.

Referring now to FIG. 5, there is shown a front view of assembly 100. When assembled the connector 140 on AC board 102 and the two coaxial connectors 144 and the two plug-in type connectors 146 on DC board 104 and the ground terminal 152 all extend above assembly 100. As can be seen by referring to FIG. 3, the connectors 140, 144 and 146 allow electrical connections to be made to boards 102 and 104 in the electronics enclosure 16; and the ground terminal 152 allows a ground wire to be attached to assembly 100 in enclosure 16. When assembled the connector 138 on AC board 102 and the two connectors 142 on DC board 104 are in alignment with cutouts 134 and 136, respectively. As can be seen by referring to FIG. 3, the cutouts allow electrical connections to be made to those boards when assembly 100 is placed in oven 14.

As is shown in FIGS. 4 and 5 there are connectors at the oven end of boards 102 and 104. Each electrical contact solders directly into the board in a fashion familiar to those skilled in the art of printed circuit board construction. In order, however, to provide strength at the oven end of boards 102 and 104, the sites where the connectors are to be soldered to the board, known as pads, are specially constructed. The pads are copper plated through holes which are over plated and over sized to act almost like a rivet through the board material.

Figure 6:
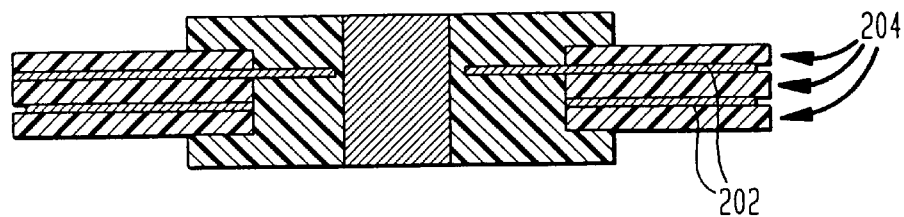
FIG. 6 shows a cross section through the connector pad arrangement for oven end of the printed circuit boards included in the assembly of the present invention.

A cross section through one such pad 200 is shown in FIG. 6. Each of the boards 102 and 104 consist of copper layers 202 separated by polyimide prepreg layers 204. As is well known to those skilled in the art of making printed circuit boards, the board has one or more holes therethrough at each location where a connector is to be soldered to the board.

Each of the copper layers of the board has a circle of copper, that is an annular ring of copper, at the location where the hole goes through that layer. The diameter of the copper circle is specified by the IPC standard known as IPC-D-275 and is dependent on factors such as the hole size and how much copper is connected to the circle. The copper circle with the hole through it is also known as a pad.

As is also well known, copper is a good conductor of heat and without thermal relief the copper circles would draw away heat during the soldering process making it difficult to solder the connector to the circuit board. Therefore, IPC standard IPC-D-275 also specifies that thermal relief should be provided for the copper circles. This thermal relief is provided in prior art circuit boards by making the pads of discontinuous copper. These pads are known as "wagon wheels" because of the spokes that are used to reduce the drawing away of heat during the soldering process that would occur if the prior art pads were made of continuous copper.

In contrast to the techniques described above used in implementing pads in circuit boards of the prior art, the copper layers of the circuit boards 102, 104 used in the present invention do not have the thermal relief for the connector pads on each conductive layer that is specified by the IPC-D-275 standard. In addition, the circuit boards 102, 104 have oversized copper circles for the connector pads which are of a diameter greater than specified by the IPC-D-275 standard. Further the holes of pad 200 are plated with copper to a predetermined thickness and the plating mechanically contacts every copper annular ring around that hole from one conductive layer to the next conductive layer. Further, all of the copper foil layers on boards 102, 104 are thicker than those customarily used in printed circuit boards.

The use of a pad made of solid continuous copper which is connected to every copper foil layer in the board has been found to provide "rivet-like" strength to the oven end of boards 102 and 104. In one embodiment of the present invention the pad had a thickness of approximately five (5) mils and the conductive traces on the boards consisted of three (3) ounce, about 85 gram, copper.

It is to be understood that the description of the preferred embodiment(s) is (are) intended to be only illustrative, rather than exhaustive, of the present invention. Those of ordinary skill will be able to make certain additions, deletions, and/or modifications to the embodiment(s) of the disclosed subject matter without departing from the spirit of the invention or its scope, as defined by the appended claims.

What is claimed is:

1. An electrical feed through assembly which is to be inserted in a high temperature oven, said assembly comprising:
   a) one or more printed circuit boards;
   b) a clam shell type housing having first and second halves, said one or more circuit boards positioned between said first and second halves;
   c) one or more sheets of compressible material positioned around said one or more printed circuit boards in a manner such that said one or more sheets extrudes over the edges of said one or more printed circuit boards when said first and second halves are joined together; and
   d) means for joining said first and second halves together so that said one or more sheets are sufficiently compressed to extrude over said one or more printed circuit board edges.

2. The electrical feed through assembly of claim 1 wherein each of said one or more sheets of compressible material is an electrical insulator.

3. The electrical feed through assembly of claim 1 wherein each of said one or more sheets of compressible material comprise compressible foam material.

4. The electrical feed through assembly of claim 3 where said compressible foam material is a closed cell silicone foam.

5. The electrical feed through assembly of claim 1 having two of said printed circuit boards and two of said sheets of compressible material, one of said two sheets positioned between said first clam shell housing half and that one of said two printed circuit boards which is adjacent said first half and the other of said two sheets positioned between said second clam shell housing half and that one of said two printed circuit boards which is adjacent said second half.

6. The electrical feed through assembly of claim 1 wherein said compressible material is positioned around only part of said one or more printed circuit boards and said first clam shell type housing half has one or more openings adjacent that part of said one or more printed circuit boards where there is not any of said compressible material to allow electrical connections to be made through said first half to said one or more circuit boards.

7. The electrical feed through assembly of claim wherein at least one of said one or more printed circuit boards comprises:
   a) one or more spaced holes through said at least one of said one or more printed circuit board, each of said one or more spaced holes plated with copper to a thickness of about 5 mils; and
   b) one or more electrically conductive layers, each of said one or more layers having three ounce copper circuits thereon;

each of said one or more electrically conductive layers comprising:

an annular ring of copper connected to said copper circuits on said layer and surrounding each of said one or more spaced holes, said annular copper ring omitting any thermal relief;

said copper plating in each of said one or more spaced holes mechanically connecting all of said annular copper rings in each of said one or more spaced holes to each other.

8. A method for manufacturing an electrical feed through which is to be inserted in a high temperature oven, said electrical feed through having one or more printed circuit boards, and first and second complementary housing halves, said method comprising the steps of:
   a) surrounding the side of each of said one or more circuit boards that will face the interior of each complementary housing half when said feed through is assembled with a compressible material; and
   b) assembling said complementary housing halves with said one or more circuit boards and said surrounding compressible material in the interior of said housing halves in a manner such that said compressible material extrudes over the edges of said one or more circuit boards.

9. A printed circuit board comprising:
   a) one or more spaced holes through said printed circuit board, each of said one or more spaced holes plated with copper to a thickness of about 5 mils; and
   b) one or more electrically conductive layers, each of said one or more layers having three ounce copper circuits thereon;

each of said one or more electrically conductive layers comprising:

an annular ring of copper connected to said copper circuits on said layer and surrounding each of said one or more spaced holes, said annular copper ring omitting any thermal relief;

said copper plating in each of said one or more spaced holes mechanically connecting all of said annular copper rings in each of said one or more spaced holes to each other.

10. The printed circuit board of claim 9 where each of said one or more spaced holes are located near the periphery of said printed circuit board.

11. The printed circuit board of claim 9 where said one or spaced holes are arranged in a first group and said printed circuit board has a connector attached to said first group of one or more spaced holes.

12. The printed circuit board of claim 9 enclosed in a housing which provides compression to said board.

13. The printed circuit board of claim 12 where said one or spaced holes are arranged in a first group and said printed circuit board has a connector attached to said first group of one or more spaced holes and said housing has an opening allowing access to said connector.

14. The printed circuit board of claim 13 where a sheet of compressible material is positioned around said board except where said connector is located and said housing compresses said compressible material sheet to extrude over the edges of said board.

* * * * *